US012757653B2

(12) United States Patent
Ebisawa et al.

(10) Patent No.: US 12,757,653 B2
(45) Date of Patent: Oct. 6, 2026

(54) METHOD OF PROCESSING SUBSTRATE, METHOD OF MANUFACTURING SEMICONDUCTOR DEVICE, SUBSTRATE PROCESSING APPARATUS, AND RECORDING MEDIUM

(71) Applicant: KOKUSAI ELECTRIC CORPORATION, Tokyo (JP)

(72) Inventors: Ryo Ebisawa, Toyama (JP); Kiyohisa Ishibashi, Toyama (JP)

(73) Assignee: KOKUSAI ELECTRIC CORPORATION, Tokyo (JP)

(*) Notice: Subject to any disclaimer, the term of this patent is extended or adjusted under 35 U.S.C. 154(b) by 873 days.

(21) Appl. No.: 17/950,418

(22) Filed: Sep. 22, 2022

(65) Prior Publication Data

US 2023/0101499 A1 Mar. 30, 2023

(30) Foreign Application Priority Data

Sep. 29, 2021 (JP) ................................ 2021-159296

(51) Int. Cl.
*H10P 14/60* (2026.01)
*C23C 16/36* (2006.01)
(Continued)

(52) U.S. Cl.
CPC .......... *H10P 14/6339* (2026.01); *C23C 16/36* (2013.01); *C23C 16/45527* (2013.01); *C23C 16/45553* (2013.01); *H10P 14/69433* (2026.01)

(58) Field of Classification Search
CPC ......... H01L 21/02312; H01L 21/02107; H01L 21/02; C23C 16/45553; H10P 14/6682;
(Continued)

(56) References Cited

U.S. PATENT DOCUMENTS

2010/0096687 A1 4/2010 Balseanu et al.
2013/0052836 A1 2/2013 Hirose et al.
(Continued)

FOREIGN PATENT DOCUMENTS

JP 2016-025262 A 2/2016
KR 10-2011-0086090 A 7/2011
(Continued)

OTHER PUBLICATIONS

Taiwan Office Action issued on May 8, 2023 for Taiwan Patent Application No. 111128283.
(Continued)

*Primary Examiner* — William B Partridge
*Assistant Examiner* — Alexandre X Ramirez
(74) *Attorney, Agent, or Firm* — Volpe Koenig

(57) ABSTRACT

There is provided a technique that includes: forming a film containing silicon, a predetermined element, and nitrogen on a substrate by performing a cycle a predetermined number of times, the cycle including: (a) forming a first layer by supplying a first gas containing silicon to the substrate; (b) forming a second layer by supplying a second gas containing silicon and differing in molecular structure from the first gas, to the substrate; (c) supplying a third gas containing the predetermined element to the substrate; and (d) modifying the first layer and the second layer by supplying a fourth gas containing nitrogen to the substrate, wherein an element capable of forming defects in the film is used as the predetermined element, and wherein in the cycle, (a) to (d) are performed in an order of: (a), (c), (b), and (d); (c), (a), (b), and (d); or (c), (a), (c), (b), and (d).

22 Claims, 8 Drawing Sheets

(51) Int. Cl.
*C23C 16/455* (2006.01)
*H10P 14/694* (2026.01)

(58) Field of Classification Search
CPC . H10P 14/6334–6339; H10P 14/69433; H10P 14/6905
See application file for complete search history.

(56) References Cited

U.S. PATENT DOCUMENTS

| | | | |
|---|---|---|---|
| 2014/0057452 | A1 | 2/2014 | Hashimoto et al. |
| 2014/0273507 | A1 | 9/2014 | Hirose et al. |
| 2014/0287597 | A1* | 9/2014 | Hirose .............. H01L 21/02167 438/786 |
| 2016/0024659 | A1 | 1/2016 | Shimamoto et al. |
| 2018/0033645 | A1* | 2/2018 | Saido ................ H01L 21/67772 |
| 2018/0363138 | A1* | 12/2018 | Nakatani ........... H01L 21/02277 |
| 2020/0279858 | A1* | 9/2020 | Xie ...................... H10D 30/694 |
| 2021/0082685 | A1 | 3/2021 | Kataoka et al. |

FOREIGN PATENT DOCUMENTS

| | | | |
|---|---|---|---|
| KR | 10-2014-0114756 | A | 9/2014 |
| KR | 10-2021-0035075 | A | 3/2021 |
| TW | 201448037 | A | 12/2014 |
| WO | 2011/125395 | A1 | 10/2011 |
| WO | 2021/053756 | A1 | 3/2021 |

OTHER PUBLICATIONS

Korean Office Action issued on May 29, 2024 for Korean Patent Application No. 10-2022-0119999.
Singapore Written Opinion issued on Feb. 8, 2024 for Singapore Patent Application No. 10202251112W.
Singapore Search Report issued on Feb. 8, 2024 for Singapore Patent Application No. 10202251112W.
European Search Report issued on February 6. 2023 for European Patent Application No. 22197136.9.

* cited by examiner

FIG. 8

| | Sample 1 | Sample 2 | Sample 3 | Sample 4 |
|---|---|---|---|---|
| Carbon concentration (atom%) | 1.81 | 2.74 | 0 | 1.09 |
| Total peak area | 26261.9 | 27719.2 | 9733.4 | 25778.2 |

METHOD OF PROCESSING SUBSTRATE, METHOD OF MANUFACTURING SEMICONDUCTOR DEVICE, SUBSTRATE PROCESSING APPARATUS, AND RECORDING MEDIUM

CROSS-REFERENCE TO RELATED APPLICATION

This application is based upon and claims the benefit of priority from Japanese Patent Application No. 2021-159296, filed on Sep. 29, 2021, the entire contents of which are incorporated herein by reference.

TECHNICAL FIELD

The present disclosure relates to a method of processing a substrate, a method of manufacturing a semiconductor device, a substrate processing apparatus, and a recording medium.

BACKGROUND

In the related art, as a process of manufacturing a semiconductor device, a process of forming a film on a surface may be carried out.

SUMMARY

Some embodiments of the present disclosure provide a technique capable of improving characteristics of a film formed on a substrate.

According to some embodiments of the present disclosure, there is provided a technique that includes: forming a film containing silicon, a predetermined element, and nitrogen on a substrate by performing a cycle a predetermined number of times, the cycle including: (a) forming a first layer by supplying a first gas containing silicon to the substrate; (b) forming a second layer by supplying a second gas, which contains silicon and differs in a molecular structure from the first gas, to the substrate; (c) supplying a third gas containing the predetermined element to the substrate; and (d) modifying the first layer and the second layer by supplying a fourth gas containing nitrogen to the substrate, wherein an element capable of forming defects in the film is used as the predetermined element, and wherein in the cycle, (a) to (d) are performed in an order of: (a), (c), (b), and (d); (c), (a), (b), and (d); or (c), (a), (c), (b), and (d).

BRIEF DESCRIPTION OF DRAWINGS

The accompanying drawings, which are incorporated in and constitute a part of the specification, illustrate embodiments of the present disclosure.

FIG. 8 is a diagram showing measurement results in an Example.

DETAILED DESCRIPTION

Reference will now be made in detail to various embodiments, examples of which are illustrated in the accompanying drawings. In the following detailed description, numerous specific details are set forth to provide a thorough understanding of the present disclosure. However, it will be apparent to one of ordinary skill in the art that the present disclosure may be practiced without these specific details. In other instances, well-known methods, procedures, systems, and components are not described in detail not to obscure aspects of the various embodiments.

Embodiments of the Present Disclosure

Embodiments of the present disclosure will now be described mainly with reference to FIGS. 1 to 4. The drawings used in the following description are schematic, and dimensional relationships, ratios, and the like of various components shown in figures may not match the actual ones. Further, dimensional relationship, ratios, and the like of various components among plural figures may not match one another.

(1) Configuration of Substrate Processing Apparatus

Figure 1:
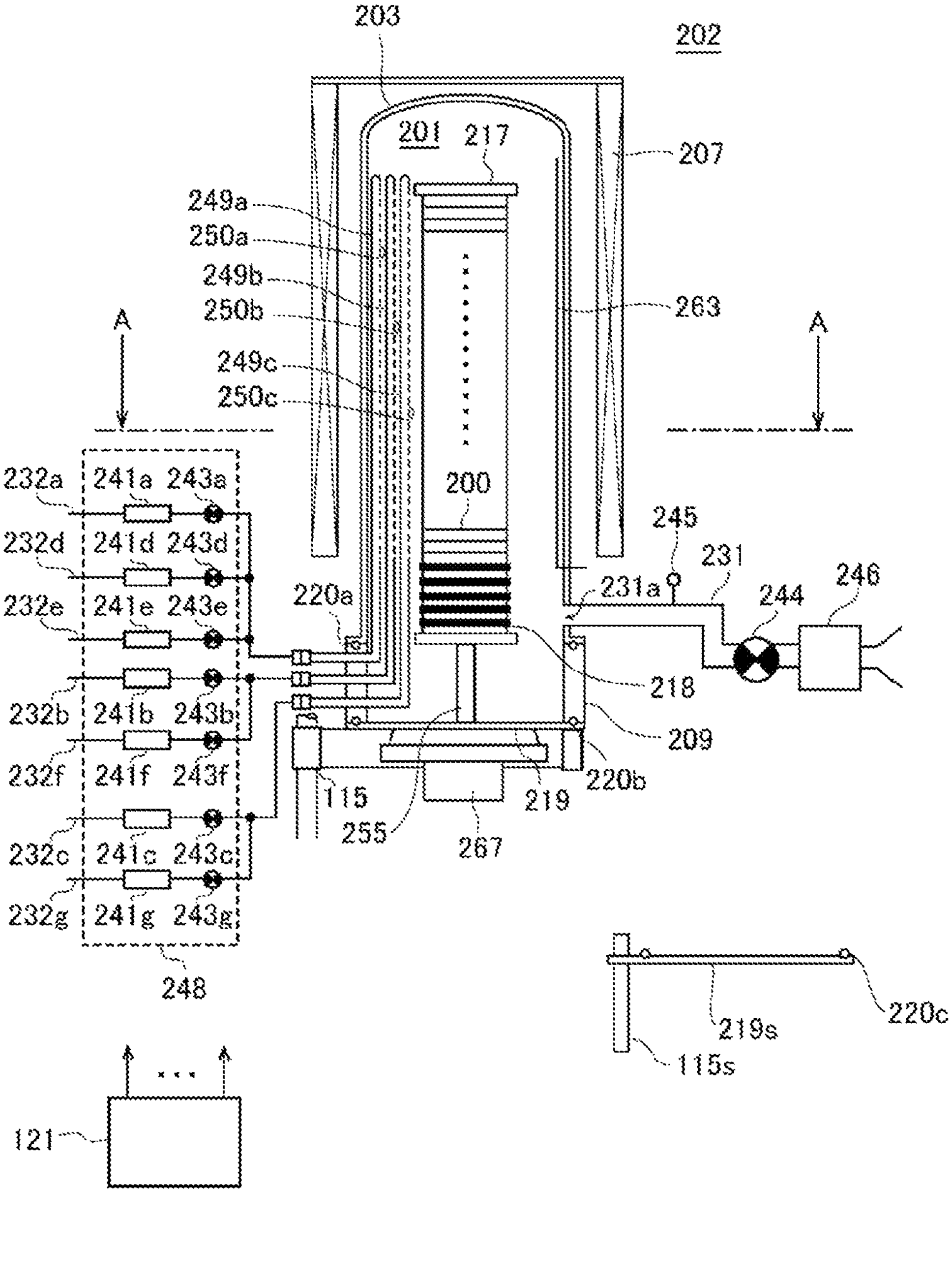
FIG. 1 is a schematic configuration view of a vertical process furnace of a substrate processing apparatus suitably used in embodiments of the present disclosure, in which a portion of a process furnace is shown in a vertical cross section.

As shown in FIG. 1, a process furnace 202 includes a heater 207 as a temperature regulator (a heating part). The heater 207 is formed in a cylindrical shape and is supported by a holding plate to be vertically installed. The heater 207 also functions as an activator (an exciter) configured to thermally activate (excite) a gas.

A reaction tube 203 is disposed inside the heater 207 to be concentric with the heater 207. The reaction tube 203 is made of, for example, a heat resistant material such as quartz ($SiO_2$) or silicon carbide (SiC), and is formed in a cylindrical shape with its upper end closed and its lower end opened. A manifold 209 is disposed to be concentric with the reaction tube 203 under the reaction tube 203. The manifold 209 is made of, for example, metal material such as stainless steel (SUS), and is formed in a cylindrical shape with both of its upper and lower ends opened. The upper end portion of the manifold 209 engages with the lower end portion of the reaction tube 203 to support the reaction tube 203. An O-ring **220*a* serving as a seal is provided between the manifold 209 and the reaction tube 203. Similar to the heater 207, the reaction tube 203 is vertically installed. A process container (reaction container) mainly includes the reaction tube 203 and the manifold 209. A process chamber 201 is formed in a hollow cylindrical portion of the process container. The process chamber 201 is configured to accommodate a plurality of wafers 200 as substrates. Processing on the wafers 200 is performed in the process chamber 201**.

Nozzles **249*a* to 249*c* as first to third suppliers are respectively installed in the process chamber 201 to penetrate through a sidewall of the manifold 209. The nozzles 249***a* to 249*c* are also referred to as first to third nozzles, respectively. The nozzles 249*a* to 249*c* are made of, for example, heat resistant material such as quartz or SiC. Gas supply pipes 232*a* to 232*c* are connected to the nozzles 249*a* to 249*c*, respectively. The nozzles 249*a* to 249*c* are different nozzles, and each of the nozzles 249*a* and 249*c* is provided adjacent to the nozzle 249*b*.

Mass flow controllers (MFCs) 241*a* to 241*c*, which are flow rate controllers (flow rate control parts), and valves 243*a* to 243*c*, which are opening/closing valves, are provided at the gas supply pipes 232*a* to 232*c*, respectively, sequentially from the upstream side of gas flow. Each of gas supply pipes 232*d* and 232*e* is connected to the gas supply pipe 232*a* at the downstream side of the valves 243*a*. Gas supply pipes 232*f* and 232*g* are connected to the gas supply pipes 232*b* and 232*c* at the downstream side of the valves 243*b* and 243*c*, respectively. MFCs 241*d* to 241*g* and valves 243*d* to 243*g* are provided at the gas supply pipes 232*d* to 232*g*, respectively, sequentially from the upstream side of gas flow. The gas supply pipes 232*a* to 232*g* are made of, for example, metal material such as SUS.

Figure 2:
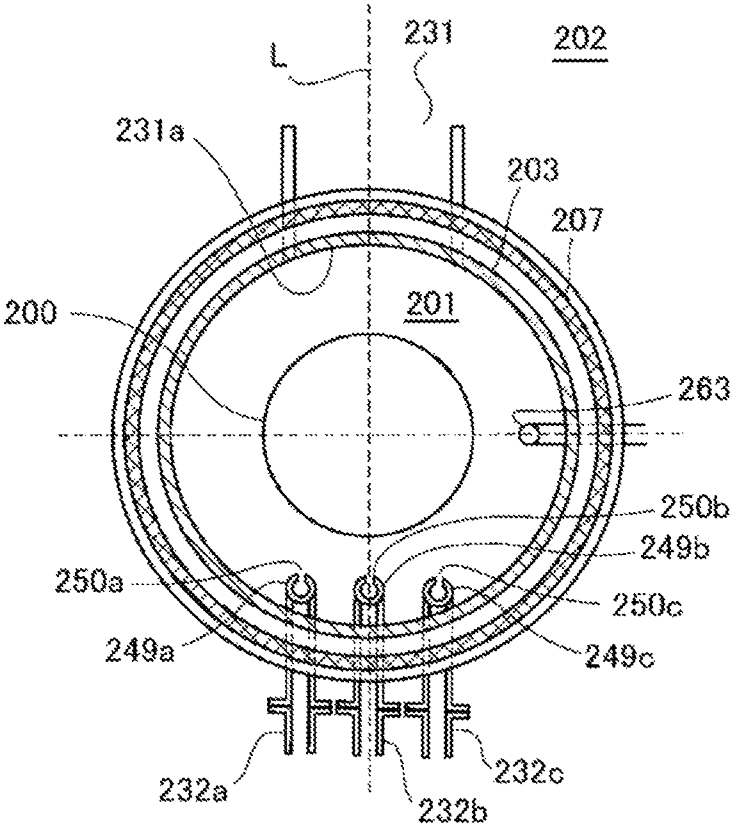
FIG. 2 is a schematic configuration view of the vertical process furnace of the substrate processing apparatus suitably used in the embodiments of the present disclosure, in which a portion of the process furnace is shown in a cross section taken along line A-A in FIG. 1.

As shown in FIG. 2, each of the nozzles 249*a* to 249*c* is installed in an annular space (in a plane view) between an inner wall of the reaction tube 203 and the wafers 200 to extend upward from a lower portion to an upper portion of the inner wall of the reaction tube 203, that is, along an arrangement direction of the wafers 200. Specifically, each of the nozzles 249*a* to 249*c* is installed in a region horizontally surrounding a wafer arrangement region in which the wafers 200 are arranged at a lateral side of the wafer arrangement region, along the wafer arrangement region. In the plane view, the nozzle 249*b* is disposed to face an exhaust port 231*a* to be described later in a straight line with centers of the wafers 200 loaded into the process chamber 201, which are interposed therebetween. The nozzles 249*a* and 249*c* are arranged to sandwich a straight line L passing through the nozzle 249*b* and the center of the exhaust port 231*a* from both sides along the inner wall of the reaction tube 203 (the outer peripheral portion of the wafers 200). The straight line L is also a straight line passing through the nozzle 249*b* and the centers of the wafers 200. That is, it may be said that the nozzle 249*c* is installed on the side opposite to the nozzle 249*a* with the straight line L interposed therebetween. The nozzles 249*a* and 249*c* are arranged in line symmetry with the straight line L as an axis of symmetry. Gas supply holes 250*a* to 250*c* configured to supply a gas are formed on the side surfaces of the nozzles 249*a* to 249*c*, respectively. Each of the gas supply holes 250*a* to 250*c* is opened to oppose (face) the exhaust port 231*a* in the plane view, which enables a gas to be supplied toward the wafers 200. A plurality of gas supply holes 250*a* to 250*c* are formed from the lower portion to the upper portion of the reaction tube 203.

A first gas containing silicon (Si) is supplied from the gas supply pipe 232*a* into the process chamber 201 via the MFC 241*a*, the valve 243*a*, and the nozzle 249*a*. The first gas is used as a precursor gas.

A third gas containing a predetermined element is supplied from the gas supply pipe 232*b* into the process chamber 201 via the MFC 241*b*, the valve 243*b*, and the nozzle 249*b*. The predetermined element is an element capable of forming defects in a film formed on the wafer 200 by performing a film-forming process to be described later. At least one selected from the group of carbon (C) and boron (B) may be used as the predetermined element.

A fourth gas containing nitrogen (N) is supplied from the gas supply pipe 232*c* into the process chamber 201 via the MFC 241*c*, the valve 243*c*, and the nozzle 249*c*. The fourth gas is used as a reaction gas.

A second gas containing Si is supplied from the gas supply pipe 232*d* into the process chamber 201 via the MFC 241*d*, the valve 243*d*, the gas supply pipe 232*a*, and the nozzle 249*a*. The second gas is a gas which is different in a molecular structure from the first gas and is used as a precursor gas.

An inert gas is supplied from the gas supply pipes 232*e* to 232*g* into the process chamber 201 via the MFCs 241*e* to 241*g*, the valves 243*e* to 243*g*, the gas supply pipes 232*a* to 232*c*, and the nozzles 249*a* to 249*c*, respectively. The inert gas acts as a purge gas, a carrier gas, a dilution gas, or the like.

A first gas supply system mainly includes the gas supply pipe 232*a*, the MFC 241*a*, and the valve 243*a*. A third gas supply system mainly includes the gas supply pipe 232*b*, the MFC 241*b*, and the valve 243*b*. A fourth gas supply system mainly includes the gas supply pipe 232*c*, the MFC 241*c*, and the valve 243*c*. A second gas supply system mainly includes the gas supply pipe 232*d*, the MFC 241*d*, and the valve 243*d*. An inert gas supply system mainly includes the gas supply pipes 232*e* to 232*g*, the MFCs 241*e* to 241*g*, and the valves 243*e* to 243*g*.

One or all of the above-described various supply systems may be configured as an integrated supply system 248 in which the valves 243*a* to 243*g*, the MFCs 241*a* to 241*g*, and so on are integrated. The integrated supply system 248 is connected to each of the gas supply pipes 232*a* to 232*g*. Further, the integrated supply system 248 is configured such that operations of supplying various materials (various gases) into the gas supply pipes 232*a* to 232*g* (that is, the opening/closing operation of the valves 243*a* to 243*g*, the flow rate regulating operation by the MFCs 241*a* to 241*g*, and the like) are controlled by a controller 121 which will be described later. The integrated supply system 248 is configured as an integral type or detachable-type integrated unit, and may be attached to and detached from the gas supply pipes 232*a* to 232*g* and the like on an integrated unit basis such that maintenance, replacement, extension, and the like of the integrated supply system 248 may be performed on an integrated unit basis.

The exhaust port 231*a* configured to exhaust an internal atmosphere of the process chamber 201 is provided below the sidewall of the reaction tube 203. As shown in FIG. 2, in the plane view, the exhaust port 231*a* is provided at a position opposing (facing) the nozzles 249*a* to 249*c* (the gas supply holes 250*a* to 250*c*) with the wafers 200 interposed therebetween. The exhaust port 231*a* may be provided from the lower portion to the upper portion of the sidewall of the reaction tube 203, that is, along the wafer arrangement region. An exhaust pipe 231 is connected to the exhaust port 231*a*. A vacuum pump 246 as a vacuum exhauster, is connected to the exhaust pipe 231 via a pressure sensor 245, which is a pressure detector (pressure detection part) configured to detect the internal pressure of the process chamber 201, and an auto pressure controller (APC) valve 244, which is a pressure regulator (pressure regulation part). The APC valve 244 is configured to be capable of performing or stopping a vacuum exhausting operation in the process chamber 201 by opening/closing the valve while the vacuum pump 246 is actuated. The APC valve 244 is further configured to be capable of regulating the internal pressure of the process chamber 201 by adjusting an opening state of the valve based on pressure information detected by the pressure sensor 245 while the vacuum pump 246 is actuated. An exhaust system mainly includes the exhaust pipe 231, the APC valve 244, and the pressure sensor 245. The exhaust system may include the vacuum pump 246.

A seal cap 219, which serves as a furnace opening lid configured to be capable of hermetically sealing a lower end opening of the manifold 209, is provided under the manifold 209. The seal cap 219 is made of, for example, metal material such as SUS, and is formed in a disc shape. An O-ring 220*b*, which is a seal making contact with the lower end of the manifold 209, is provided on an upper surface of the seal cap 219. A rotator 267 configured to rotate a boat 217, which will be described later, is installed under the seal cap 219. A rotary shaft 255 of the rotator 267 is connected to the boat 217 through the seal cap 219. The rotator 267 is configured to rotate the wafers 200 by rotating the boat 217. The seal cap 219 is configured to be vertically moved up or down by a boat elevator 115 which is an elevating mechanism installed outside the reaction tube 203. The boat elevator 115 is configured as a transporter (transport mechanism) which loads/unloads (transports) the wafers 200 into/out of the process chamber 201 by moving the seal cap 219 up or down. The transporter functions as a provider that provides the wafers 200 into the process chamber 201.

A shutter 219*s*, which serves as a furnace opening lid configured to be capable of hermetically sealing a lower end opening of the manifold 209 in a state where the seal cap 219 is lowered and the boat 217 is unloaded from the process chamber 201, is provided under the manifold 209. The shutter 219*s* is made of, for example, metal material such as SUS, and is formed in a disc shape. An O-ring 220*c*, which is a seal making contact with the lower end of the manifold 209, is provided on an upper surface of the shutter 219*s*. The opening/closing operation (such as elevation operation, rotation operation, or the like) of the shutter 219*s* is controlled by a shutter opening/closing mechanism 115*s*.

The boat 217 serving as a substrate support is configured to support a plurality of wafers 200, for example, 25 to 200 wafers, in such a state that the wafers 200 are arranged in a horizontal posture and in multiple stages along a vertical direction with the centers of the wafers 200 aligned with one another. That is, the boat 217 is configured to arrange the wafers 200 to be spaced apart from each other. The boat 217 is made of heat resistant material such as quartz or SiC. Heat insulating plates 218 made of heat resistant material such as quartz or SiC are installed below the boat 217 in multiple stages.

A temperature sensor 263 serving as a temperature detector is installed in the reaction tube 203. Based on temperature information detected by the temperature sensor 263, a state of supplying electric power to the heater 207 is regulated such that a temperature distribution in the process chamber 201 becomes a desired temperature distribution. The temperature sensor 263 is provided along the inner wall of the reaction tube 203.

Figure 3:
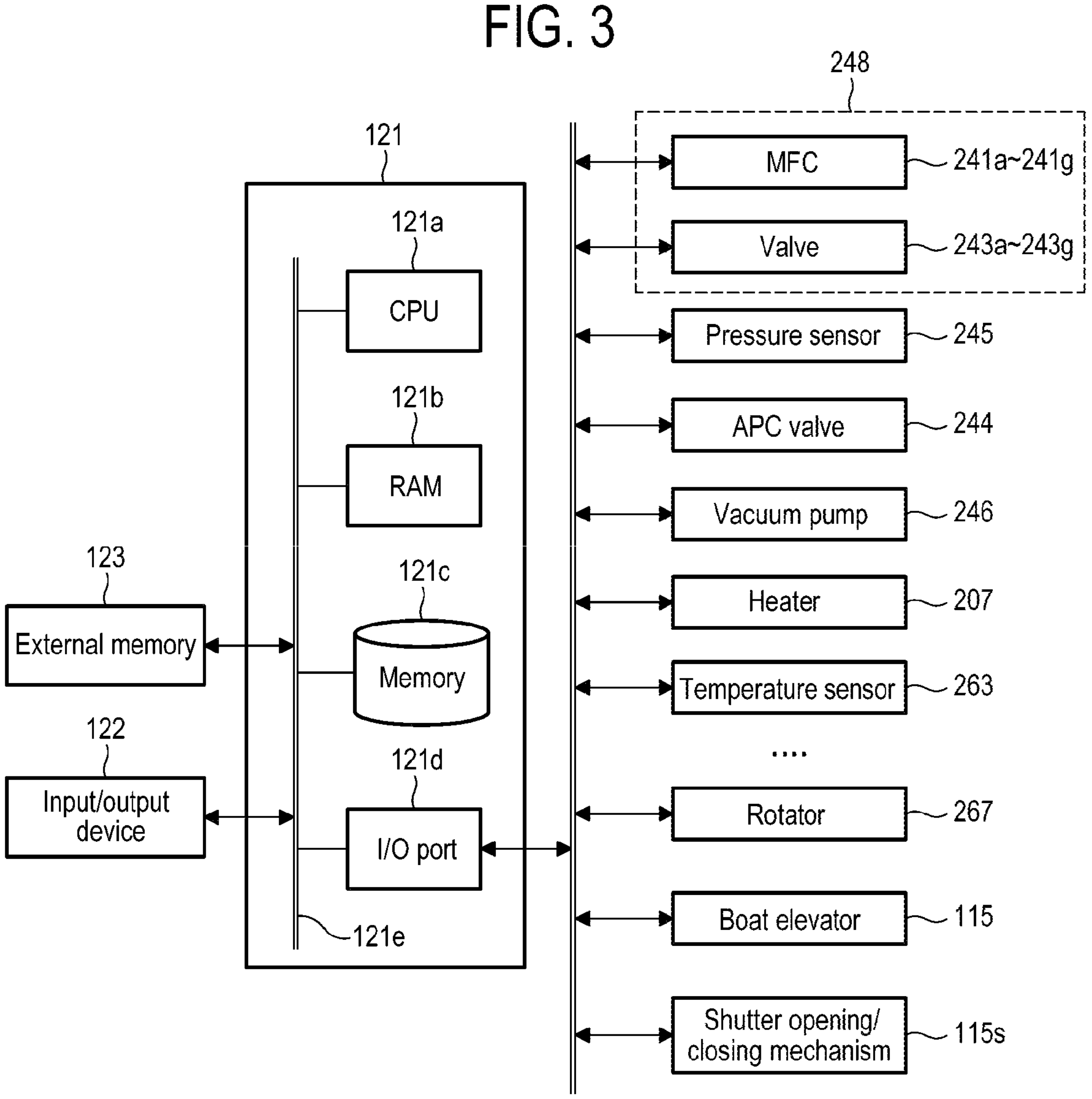
FIG. 3 is a schematic configuration diagram of a controller of the substrate processing apparatus suitably used in the embodiments of the present disclosure, in which a control system of the controller is shown in a block diagram.

As shown in FIG. 3, a controller 121, which is a control part (control means or unit), is configured as a computer including a central processing unit (CPU) 121*a*, a random access memory (RAM) 121*b*, a memory 121*c*, and an I/O port 121*d*. The RAM 121*b*, the memory 121*c*, and the I/O port 121*d* are configured to be capable of exchanging data with the CPU 121*a* via an internal bus 121*e*. An input/output device 122 formed of, e.g., a touch panel or the like, is connected to the controller 121. Further, an external memory 123 may be connected to the controller 121.

The memory 121*c* is configured by, for example, a flash memory, a hard disk drive (HDD), a solid state drive (SSD) or the like. A control program that controls operations of a substrate processing apparatus, a process recipe in which sequences and conditions of substrate processing to be described later are written, and the like are readably stored in the memory 121*c*. The process recipe functions as a program that causes, by the controller 121, the substrate processing apparatus to execute each sequence in the substrate processing, which will be described later, to obtain a predetermined result. Hereinafter, the process recipe and the control program may be generally and simply referred to as a "program." Furthermore, the process recipe may be simply referred to as a "recipe." When the term "program" is used herein, it may indicate a case of including the recipe, a case of including the control program, or a case of including both the recipe and the control program. The RAM 121*b* is configured as a memory area (work area) in which programs or data read by the CPU 121*a* are temporarily stored.

The I/O port 121*d* is connected to the MFCs 241*a* to 241*g*, the valves 243*a* to 243*g*, the pressure sensor 245, the APC valve 244, the vacuum pump 246, the temperature sensor 263, the heater 207, the rotator 267, the boat elevator 115, the shutter opening/closing mechanism 115*s*, and so on.

The CPU 121*a* is configured to read and execute the control program from the memory 121*c*. The CPU 121*a* is also configured to be capable of reading the recipe from the memory 121*c* according to an input of an operation command from the input/output device 122. The CPU 121*a* is configured to be capable of controlling the flow rate regulating operation of various kinds of materials (gases) by the MFCs 241*a* to 241*g*, the opening/closing operation of the valves 243*a* to 243*g*, the opening/closing operation of the APC valve 244, the pressure regulating operation performed by the APC valve 244 based on the pressure sensor 245, the actuating and stopping operation of the vacuum pump 246, the temperature regulating operation performed by the heater 207 based on the temperature sensor 263, the operation of rotating the boat 217 with the rotator 267 and adjusting the rotation speed of the boat 217, the operation of moving the boat 217 up or down by the boat elevator 115, the opening/closing operation of the shutter 219*s* by the shutter opening/closing mechanism 115*s*, and so on, according to contents of the read recipe.

The controller 121 may be configured by installing, on the computer, the aforementioned program stored in the external memory 123. Examples of the external memory 123 may include a magnetic disk such as a HDD, an optical disc such as a CD, a magneto-optical disc such as an MO, a semiconductor memory such as an USB memory or a SSD, and the like. The memory 121*c* or the external memory 123 is configured as a non-transitory computer-readable recording medium. Hereinafter, the memory 121*c* and the external memory 123 may be generally and simply referred to as a "recording medium." When the term "recording medium" is used herein, it may indicate a case of including the memory 121*c*, a case of including the external memory 123, or a case of including both the memory 121*c* and the external memory 123. Furthermore, the program may be provided to the computer using communication means or unit such as the Internet or a dedicated line, instead of using the external memory 123.

(2) Substrate Processing Process

Figure 4:
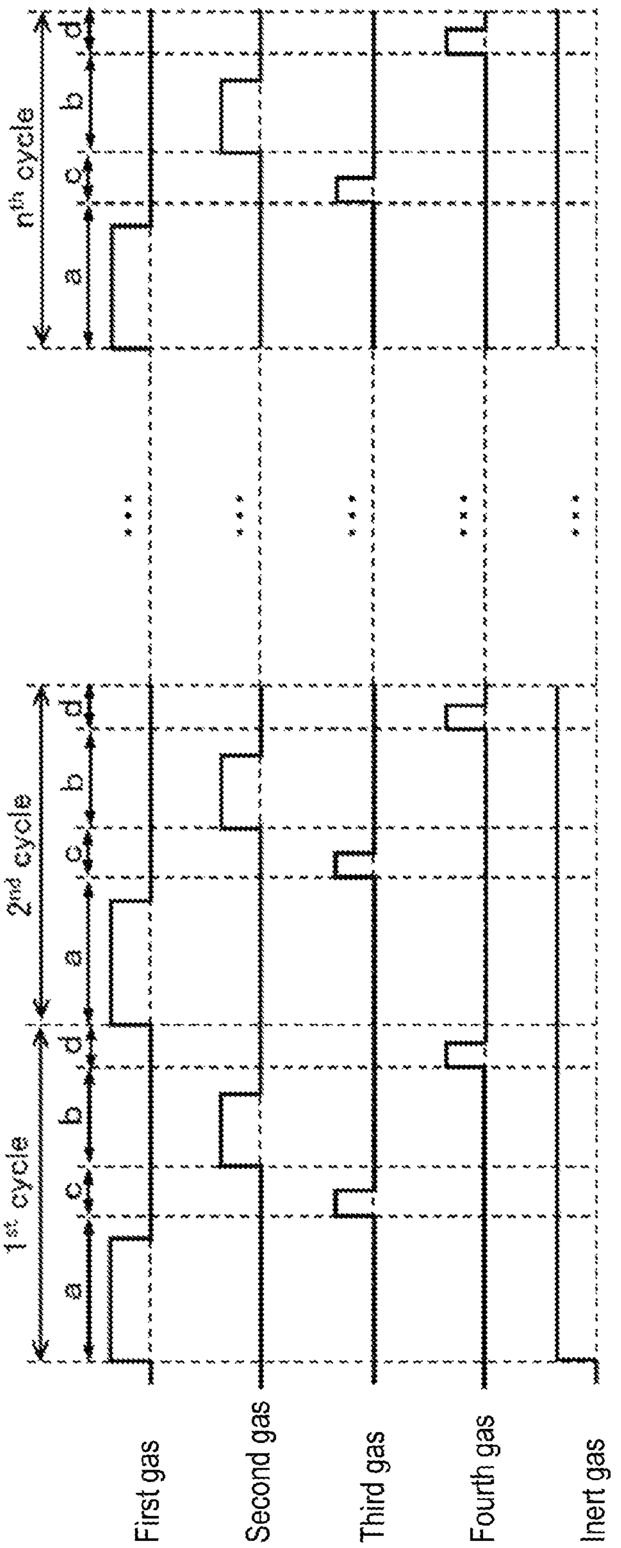
FIG. 4 is a diagram showing a processing sequence in the embodiments of the present disclosure.

As a process of manufacturing a semiconductor device by using the above-described substrate processing apparatus, a sequence example of performing a process on a wafer 200 as a substrate, that is, a film-forming sequence example of forming a film on the wafer 200, will be described mainly with reference to FIG. 4. In the following descriptions, the operations of the respective components constituting the substrate processing apparatus are controlled by the controller 121.

A film-forming sequence according to the embodiments of the present disclosure includes:

forming a silicon carbonitride film (SiCN film or C-doped SiN film) on a wafer 200, as a film containing Si, C, and N by performing a cycle a predetermined number of times (n times, where n is an integer of 1 or more), the cycle including:

step a of forming a first layer by supplying a first gas containing Si to the wafer 200;

step b of forming a second layer by supplying a second gas, which contains Si and differs in a molecular structure from the first gas, to the wafer 200;

step c of supplying a third gas containing, for example, C as a predetermined element, to the wafer 200; and step d of modifying the first layer and the second layer by supplying a fourth gas containing N to the wafer 200.

In the above-described cycle, steps a to d are performed non-simultaneously in the order of: steps a, c, b, and d; steps c, a, b, and d; or steps c, a, c, b, and d. FIG. 4 shows an example in which steps a to d are performed non-simultaneously in the order of steps a, c, b, and d. In FIG. 4, execution periods of steps a, b, c, and d are represented by a, b, c, and d, respectively.

In the following description, an example of forming a charge trap (charge capture) film composed of a SiCN film, as a film, will be described.

In the present disclosure, the above-described processing sequence may also be indicated as follows for the sake of convenience. The same notation is used also in the description of the following modifications and other embodiments.

(First gas→Third gas→Second gas→Fourth gas)×*n*⇒SiCN

When the term "wafer" is used in the present disclosure, it may refer to "a wafer itself" or "a stacked body of a wafer and certain layers or films formed on the wafer." When the phrase "a surface of a wafer" is used in the present disclosure, it may refer to "a surface of a wafer itself" or "a surface of a certain layer formed on a wafer." When the expression "a certain layer is formed on a wafer" is used in the present disclosure, it may mean that "a certain layer is formed directly on a surface of a wafer itself" or that "a certain layer is formed on a layer formed on a wafer." When the term "substrate" is used in the present disclosure, it may be synonymous with the term "wafer."

(Wafer Charging and Boat Loading)

After the boat 217 is charged with a plurality of wafers 200 (wafer charging), the shutter **219*s* is moved by the shutter opening/closing mechanism 115*s* and the lower end opening of the manifold 209 is opened (shutter open). Thereafter, as shown in FIG. 1, the boat 217 charged with the plurality of wafers 200 is lifted up by the boat elevator 115 to be loaded into the process chamber 201 (boat loading). In this state, the seal cap 219 seals the lower end of the manifold 209 via the O-ring 220*b*. In this way, the wafers 200 are loaded into the process chamber 201**.

(Pressure Regulation and Temperature Regulation)

After the boat loading is completed, the interior of the process chamber 201, that is, a space where the wafers 200 are placed, is vacuum-exhausted (decompression-exhausted) by the vacuum pump 246 to reach a desired pressure (state of vacuum). At this time, the internal pressure of the process chamber 201 is measured by the pressure sensor 245, and the APC valve 244 is feedback-controlled based on the measured pressure information. Further, the wafers 200 in the process chamber 201 are heated by the heater 207 to reach a desired processing temperature. At this time, a state of supplying electric power to the heater 207 is feedback-controlled based on the temperature information detected by the temperature sensor 263 such that a temperature distribution in the process chamber 201 becomes a desired temperature distribution. Further, the rotation of the wafers 200 by the rotator 267 is started. The exhaust of the interior of the process chamber 201 and the heating and rotation of the wafers 200 are continuously performed at least until the processing on the wafers 200 is completed.

(Film-Forming Process)

After that, the following steps a to d are executed in order of a, c, b, and d.

[Step a]

In step a, a first gas is supplied to the wafer 200 inside the process chamber 201.

Specifically, the valve **243*a* is opened to allow the first gas to flow into the gas supply pipe 232*a*. The flow rate of the first gas is regulated by the MFC 241*a*, and the first gas is supplied into the process chamber 201 via the nozzle 249*a* and is exhausted via the exhaust port 231*a*. In this operation, the first gas is supplied to the wafer 200 from the side of the wafer 200 (supply of first gas). At this time, the valves 243*e* to 243*g* may be opened to allow an inert gas to be supplied into the process chamber 201 via the nozzles 249*a* to 249*c***, respectively. It should be noted that the supply of the inert gas may not be performed for some methods to be described below.

A process condition under which the first gas is supplied in this step is exemplified as follows.

Processing temperature: 450 to 750 degrees C., specifically 650 to 700 degrees C.

Processing pressure: 20 to 133 Pa, specifically 40 to 70 Pa

First gas supply flow rate: 0.01 to 2 slm, specifically 0.1 to 1 slm

First gas supply time: 6 to 60 seconds, specifically 10 to 30 seconds

Inert gas supply flow rate (for each gas supply pipe): 0 to 20 slm

By setting the pressure to 133 Pa or less, it is possible to prevent decomposition of the gas, although other factors such as temperature are also involved.

In the present disclosure, notation of a numerical range such as "450 degrees C. to 750 degrees C." means that a lower limit value and an upper limit value are included in the range. Therefore, for example, "450 degrees C. to 750 degrees C." means "450 degrees C. or higher and 750 degrees C. or lower." The same applies to other numerical ranges. In the present disclosure, the processing temperature means the temperature of the wafer 200 or the internal temperature of the process chamber 201, and the processing pressure means the internal pressure of the process chamber 201. Further, 0 slm is included in the supply flow rate, 0 slm means a case where no gas is supplied. These apply equally to the following description.

By supplying the first gas, for example, a chlorosilane-based gas, to the wafer 200 under the above-mentioned process condition, a first layer (Si-containing layer) is formed on the outermost surface of the wafer 200, as a base. The first layer is formed by physical adsorption or chemical adsorption of molecules of the chlorosilane-based gas, physical adsorption or chemical adsorption of molecules of a substance obtained by partially decomposing the chlorosilane-based gas, or the like on the outermost surface of the wafer 200. The first layer may be an adsorption layer (physical adsorption layer or chemical adsorption layer) of molecules of a chlorosilane-based gas or molecules of a substance obtained by partially decomposing the chlorosilane-based gas.

In a case where the processing temperature is lower than 450 degrees C., it may be difficult for Si to adsorb on the wafer 200, making it difficult to form the first layer. By setting the processing temperature to 450 degrees C. or higher, it is possible to form the first layer on the wafer 200. By setting the processing temperature to 650 degrees C. or higher, it is possible to more sufficiently form the first layer on the wafer 200.

In a case where the processing temperature exceeds 750 degrees C., for example, the chlorosilane-based gas as the first gas is thermally decomposed and multiple layers of Si are deposited on the wafer 200, which may make it difficult to form the thin first layer with substantially a uniform thickness of less than one atomic layer. By setting the processing temperature to 750 degrees C. or lower, the first layer with substantially a uniform thickness of less than one atomic layer may be formed, thereby improving step coverage characteristics and wafer in-plane film thickness uniformity of the first layer. By setting the processing temperature to 700 degrees C. or lower, the step coverage characteristics and the wafer in-plane film thickness uniformity of the first layer may be further improved. Here, a layer with a thickness of less than one atomic layer means an atomic layer formed discontinuously, and a layer with a thickness of one atomic layer means an atomic layer formed continuously. Further, the fact that a layer with a thickness of less than one atomic layer is substantially uniform means that atoms are adsorbed on the surface of the wafer 200 at substantially a uniform density.

In this step, when, for example, a chlorosilane-based gas as the first gas exists alone in the process chamber 201, the processing temperature is set to a temperature lower than a temperature at which the first gas is substantially thermally decomposed (vapor phase-decomposed) (450 to 750 degrees C.). As a result, physical adsorption and chemical adsorption of molecules of the chlorosilane-based gas and molecules of a substance obtained by partially decomposing the chlorosilane-based gas predominantly (preferentially) occur on the outermost surface of the wafer 200, and a little or almost no deposition of Si due to the thermal decomposition of the chlorosilane-based gas occurs. That is, under the above-mentioned process condition, the first layer includes an overwhelmingly large amount of adsorption layer (physical adsorption layer and chemical adsorption layer) of molecules of the chlorosilane-based gas and molecules of the substance obtained by partially decomposing the chlorosilane-based gas, such that a little or almost no Si deposition layer containing Cl is included.

After the first layer is formed, the valve 243*a* is closed to stop the supply of the first gas into the process chamber 201. Then, the interior of the process chamber 201 is vacuum-exhausted to remove a gaseous substance and the like remaining in the process chamber 201 from the interior of the process chamber 201. At this time, the supply of an inert gas into the process chamber 201 is maintained by keeping the valves 243*e* to 243*g* open. The inert gas supplied via each of the nozzles 249*a* to 249*c* acts as a purge gas, thereby purging the interior of the process chamber 201 (purging).

A process condition when the purging is performed in this step is exemplified as follows.

Inert gas supply flow rate (for each gas supply pipe): 0.5 to 20 slm

Inert gas supply time: 1 to 60 seconds, specifically 2 to 20 seconds

Other process conditions are the same as the process conditions when the first gas is supplied in this step.

A silane-based gas containing silicon (Si) as a main element forming a film formed on the wafer 200 may be used as the first gas. For example, a gas containing Si and halogen, that is, a halosilane-based gas, may be used as the silane-based gas. Halogen includes chlorine (Cl), fluorine (F), bromine (Br), iodine (I), and the like. For example, the above-mentioned chlorosilane-based gas containing Si and Cl may be used as the halosilane-based gas.

Chlorosilane-based gases such as a tetrachlorosilane ($SiCl_4$, abbreviation: STC) gas, a dichlorosilane ($SiH_2Cl_2$, abbreviation: DCS) gas, and a trichlorosilane ($SiHCl_3$, abbreviation: TCS) gas may be used as the first gas. One or more selected from the group of these gases may be used as the first gas.

Among these gases, a silane-based gas that does not contain a Si—Si bond may be used as the first gas.

Rare gases such as a nitrogen ($N_2$) gas, an argon (Ar) gas, a helium (He) gas, a neon (Ne) gas, and a xenon (Xe) gas may be used as the inert gas. One or more selected from the group of these gases may be used as the inert gas. This also applies to each step to be described later.

[Step c]

In step c, a third gas is supplied to the wafer 200 in the process chamber 201, that is, the first layer formed on the wafer 200.

Specifically, the valve 243*b* is opened to allow the third gas to flow into the gas supply pipe 232*b*. The flow rate of the third gas is regulated by the MFC 241*b*, and the third gas is supplied into the process chamber 201 via the nozzle 249*b* and is exhausted via the exhaust port 231*a*. In this operation, the third gas is supplied to the wafer 200 from the side of the wafer 200 (third gas supply). At this time, with the valves 243*e* to 243*g* kept open, an inert gas is supplied into the process chamber 201 via the nozzles 249*a* to 249*c*, respectively.

A process condition when the third gas is supplied in this step is exemplified as follows:

Processing pressure: 10 to 50 Pa, specifically 15 to 30 Pa

Third gas supply flow rate: 0.05 to 6 slm, specifically 0.5 to 2 slm

Third gas supply time: 2 to 60 seconds, specifically 4 to 30 seconds

Other process conditions are the same as the process conditions when the first gas is supplied in step a.

By supplying the third gas containing, for example, C as a predetermined element to the first layer formed on the wafer 200 under the above-mentioned process condition, C may be adsorbed on the first layer formed on the wafer 200. By adsorbing C on the first layer, defects (crystal defects) that capture (trap) charges may be formed (introduced) in a layer formed by nitriding the first layer formed by performing a cycle, and further, in a SiCN film finally formed on the wafer 200.

After forming a C-containing layer by adsorbing C on the first layer, the valve 243*b* is closed to stop the supply of the third gas into the process chamber 201. Then, a gaseous substance and the like remaining in the process chamber 201 are removed from the interior of the process chamber 201 (purging) according to the same processing procedure and process condition as the above-described purging. Further, the processing temperature when the purging is performed in this step may be the same temperature as the processing temperature when the third gas is supplied.

For example, a C-containing gas may be used as the third gas. For example, the above-mentioned hydrocarbon-based gases such as a propylene ($C_3H_6$) gas, an ethylene ($C_2H_4$) gas, and an acetylene ($C_2H_2$) gas may be used as the C-containing gas. One or more selected from the group of these gases may be used as the third gas.

In addition to the hydrocarbon-based gases, for example, amine-based gases such as a triethylamine ($(C_2H_5)_3N$, abbreviation: TEA) gas and a diethylamine ($(C_2H_5)_2NH$, abbreviation: DEA) gas may be used as the third gas. One or more selected from the group of these gases may be used as the third gas.

In addition to these, for example, alkylsilane-based gases such as a trimethylsilane ($SiH(CH_3)_3$, abbreviation: TMS) gas, a dimethylsilane ($SiH_2(CH_3)_2$, abbreviation: DMS) gas, a triethylsilane ($SiH(C_2H_5)_3$, abbreviation: TES) gas, and a diethylsilane ($SiH_2(C_2H_5)_2$, abbreviation: DES) gas may be used as the third gas. One or more selected from the group of these gases may be used as the third gas.

[Step b]

In step b, a second gas is supplied to the wafer 200 in the process chamber 201, that is, the C-adsorbed first layer (or referred as the first layer containing C or the first layer including the C-containing layer formed on its surface) formed on the wafer 200.

Specifically, the valve 243*d* is opened to allow the second gas to flow into the gas supply pipe 232*a*. The flow rate of the second gas is regulated by the MFC 241*d*, and the second gas is supplied into the process chamber 201 via the nozzle 249*a* and is exhausted via the exhaust port 231*a*. In this operation, the second gas is supplied to the wafer 200 from the side of the wafer 200 (second gas supply). At this time, with the valves 243*e* to 243*g* kept open, an inert gas is supplied into the process chamber 201 via the nozzles 249*a* to 249*c*, respectively.

A process condition when the second gas is supplied in this step is exemplified as follows:

Processing pressure: 20 to 133 Pa, specifically 40 to 70 Pa

Second gas supply flow rate: 0.01 to 1.5 slm, specifically 0.1 to 0.8 slm

Second gas supply time: 6 to 30 seconds, specifically 10 to 20 seconds

Other process conditions are the same as the process conditions when the first gas is supplied in step a.

By supplying, as the second gas, for example, a chlorosilane-based gas which differs in a molecular structure from the first gas, to the wafer 200 under the above-mentioned process condition, a Si-containing layer is formed as a second layer on the first layer on which C is mainly adsorbed. The second layer is formed by deposition of Si due to thermal decomposition of the chlorosilane-based gas on the first layer on which C is mainly adsorbed.

More specifically, in this step, for example, when the chlorosilane-based gas alone exists as the second gas in the process chamber 201, the processing temperature is set to a temperature at which the second gas is substantially thermally decomposed (vapor phase-decomposed) (450 to 750 degrees C.). As a result, most of the molecular structure of the second gas is thermally decomposed, and a Si-containing layer in which multiple layers of Si are deposited on the first layer on which C is adsorbed is formed as the second layer.

In a case where the processing temperature is lower than 450 degrees C., the second gas is difficult to be thermally decomposed, which may make it difficult to form the second layer. By setting the processing temperature to 450 degrees C. or higher, the second gas is thermally decomposed, such that a layer in which, for example, multiple layers of Si are deposited may be formed as the second layer on the first layer on which C is adsorbed. As a result, the film formation rate of the SiCN film may be increased. By setting the processing temperature to 650 degrees C. or higher, the second gas is more sufficiently thermally decomposed, such that a layer in which, for example, multiple layers of Si are deposited may be more sufficiently formed. As a result, the film formation rate of the SiCN film may be sufficiently increased.

In a case where the processing temperature exceeds 750 degrees C., the thermal decomposition of the second gas may proceed excessively, making it difficult to form the second layer. By setting the processing temperature to 750 degrees C. or lower, it is possible to form the second layer by suppressing the excessive thermal decomposition of the second gas. By setting the processing temperature to 700 degrees C. or lower, it is possible to more sufficiently form the second layer by more sufficiently suppressing the excessive thermal decomposition of the second gas.

As described above, defects in the layer are formed by the adsorption of C on the first layer. Therefore, as will be described later, when the SiCN film is finally formed, many defects are formed in the first layer portion on which C is adsorbed.

In a case where the thickness of the layers formed on the wafer 200 in steps a to c exceeds several atomic layers, the effect of modification in step d, which will be described later, may not reach the entire Si-containing layer. Therefore, a sum of the thickness of the second layer and the thickness of the layers formed by steps 1 and 2 may be on the order of several atomic layers.

Further, in the embodiments of the present disclosure, the processing temperatures in steps a to c are substantially the same. As a result, since the temperature of the wafer 200, that is, the internal temperature of the process chamber 201, may not be changed among steps a to c, waiting time for stabilization of the temperature of the wafer 200 among the steps may be eliminated, thereby improving a productivity of the film-forming process.

Further, when the processing temperatures in steps a to c are substantially the same temperature, for example, a gas, which is higher in a thermal decomposition temperature than the second gas, may be used as the first gas in step a such that the thermal decomposition of the first gas does not substantially occur (that is, is suppressed) in step a and the thermal decomposition of the second gas occurs (that is, is promoted) in step b.

After the second layer is formed on the wafer 200, the valve 243*d* is closed to stop the supply of the second gas into the process chamber 201. Then, a gaseous substance and the like remaining in the process chamber 201 are removed from the interior of the process chamber 201 (purging), according to the same processing procedure and process condition as the above-described purging. Further, the processing temperature when the purging is performed in this step may be the same as the processing temperature when the second gas is supplied.

For example, a silane-based gas containing Si as a main element forming the film formed on the wafer 200 and differing in a molecular structure from the first gas may be used as the second gas.

Inorganic-based chlorosilane precursor gases such as a hexachlorodisilane ($Si_2Cl_4$, abbreviation: HCDS) gas and an octachlorotrisilane ($Si_3Cl_8$, abbreviation: OCTS) gas may be used as the second gas. These gases may be said to precursor gases containing at least two Si atoms in one molecule and containing Si—Si bonds. In addition to these gases, chlorosilane-based gases such as a tetrachlorosilane ($SiCl_4$, abbreviation: STC) gas, silicon hydride-based gases such as a monosilane ($SiH_4$, abbreviation: MS) gas, and aminosilane-based gases such as a tris(dimethylamino)silane ($Si[N(CH_3)_2]_3H$ (abbreviation: 3DMAS) gas and a bis(diethylamino)silane ($SiH_2[N(C_2H_5)_2]_2$, abbreviation: BDEAS) gas may be used as the second gas. One or more selected from the group of these gases may be used as the second gas. By using a non-halogen gas as the second gas, it is possible to avoid halogen from mixing into the SiCN film finally formed on the wafer 200.

Among these gases, as the second gas, the above-mentioned gases and, in addition to those gases, silane-based gases containing Si—Si bonds.

[Step d]

In step d, a fourth gas is supplied to the wafer 200 in the process chamber 201.

Specifically, the valve 243*c* is opened to allow the fourth gas to flow into the gas supply pipe 232*c*. The flow rate of the fourth gas is regulated by the MFC 241*b*, and the fourth gas is supplied into the process chamber 201 via the nozzle 249*b* and is exhausted via the exhaust port 231*a*. In this operation, the fourth gas is supplied to the wafer 200 from the side of the wafer 200 (fourth gas supply). At this time, with the valves 243*e* to 243*g* kept open, an inert gas is supplied into the process chamber 201 via the nozzles 249*a* to 249*c*, respectively.

A process condition when the fourth gas is supplied in this step are exemplified as follows:

Processing pressure: 133 to 1,330 Pa, specifically 650 to 950 Pa

Fourth gas supply flow rate: 1.0 to 9 slm, specifically 3.0 to 7 slm

Fourth gas supply time: 10 to 60 seconds, specifically 20 to 50 seconds

Other process conditions are the same as the process conditions when the first gas is supplied in step a.

By supplying the fourth gas containing nitrogen (N) to the wafer 200 under the above-mentioned process condition, at least a portion of the first layer and at least a portion of the second layer may be modified (nitrided) respectively. As a result, a layer formed by lamination of a layer formed by nitriding the first layer containing C and a layer formed by nitriding the second layer not containing C or containing C of a concentration lower than that of the first layer, that is, a silicon carbonitride layer (SiCN layer) containing Si, C, and N, is formed on the wafer 200.

After the SiCN layer is formed, the valve 243*c* is closed to stop the supply of the fourth gas into the process chamber 201. Then, a gaseous substance and the like remaining in the process chamber 201 are removed from the interior of the process chamber 201 (purging), according to the same processing procedure and process condition as the above-described purging. Further, the processing temperature when the purging is performed in this step may be the same as the processing temperature when the fourth gas is supplied.

For example, a nitrogen (N)- and hydrogen (H)-containing gas, which is a nitriding gas (nitriding agent), may be used as the fourth gas. The N- and H-containing gas may be both a N-containing gas and a H-containing gas.

For example, hydrogen nitride-based gases such as an ammonia ($NH_3$) gas, a diazene ($N_2H_2$) gas, a hydrazine ($N_2H_4$) gas, and a $N_3H_8$ gas may be used as the fourth gas. One or more selected from the group of these gases may be used as the fourth gas.

In addition to these gases, for example, a nitrogen (N)-, carbon (C)- and hydrogen (H)-containing gas may be used as the fourth gas. For example, an amine-based gas or an organic hydrazine-based gas may be used as the N-, C- and H-containing gas. The N-, C- and H-containing gas is a N-containing gas, a C-containing gas, a H-containing gas, and a N- and C-containing gas.

Examples of the fourth gas may include ethylamine-based gases such as a monoethylamine ($C_2H_5NH_2$, abbreviation: MEA) gas, a diethylamine ($(C_2H_5)_2NH$, abbreviation: DEA) gas, and a triethylamine ($(C_2H_5)_3N$, abbreviation: TEA) gas, methylamine-based gases such as a monomethylamine ($CH_3NH_2$, abbreviation: MMA) gas, a dimethylamine ($(CH_3)_2NH$, abbreviation: DMA) gas, and a trimethylamine ($(CH_3)_3N$, abbreviation: TMA) gas, organic hydrazine-based gases such as a monomethylhydrazine ($(CH_3)HN_2H_2$, abbreviation: MMH) gas, a dimethylhydrazine ($(CH_3)_2N_2H_2$, abbreviation: DMH) gas, and a trimethylhydrazine ($(CH_3)_2N_2(CH_3)H$, abbreviation: TMH) gas, and the like. One or more selected from the group of these gases may be used as the fourth gas.

[Performing Predetermined Number of Times]

Figure 7:
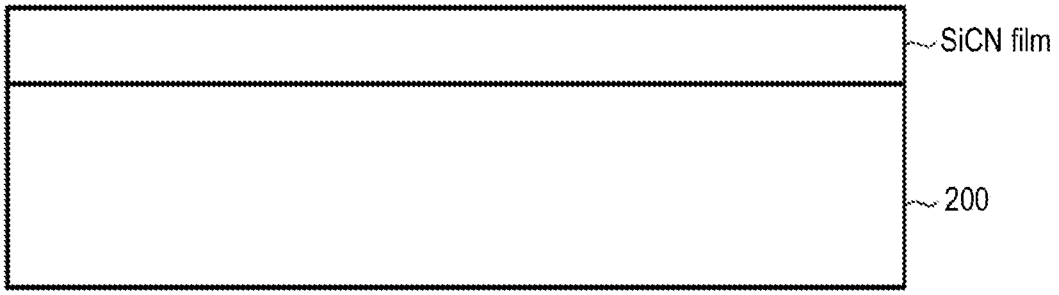
FIG. 7 is a view showing a film formed by the substrate processing apparatus suitably used in the embodiments of the present disclosure.

By performing a cycle a predetermined number of times (n times, where n is an integer of 1 or more), the cycle performing the above-described steps a to d non-simultaneously, that is, without synchronization, as shown in FIG. 7, a SiCN film may be formed by stacking a predetermined number of the aforementioned SiCN layers formed per cycle on the wafer 200. More specifically, a SiCN film containing Si, N, C, and the like as its composition and containing defects formed in the film by adding C may be formed on the wafer 200. In the SiCN film, a density of defects formed in the layer formed by nitriding the first layer is higher than a density of defects formed in the layer formed by nitriding the second layer. The above cycle is preferably performed a plurality of times. That is, the thickness of the SiCN layer formed per cycle may be set to be smaller than a desired film thickness, and the above cycle is preferably performed a plurality of times until the film thickness of the SiCN film formed by stacking the SiCN layers reaches the desired film thickness.

By supplying the first to fourth gases to the wafer 200 under the above-mentioned process condition, the concentration of C in the SiCN film may be reduced to 5 atom % or less. The concentration of C in the SiCN film may be, specifically 1 atom % or more and 5 atom % or less, more specifically 1.5 atom % or more and 4 atom % or less, even more specifically 2 atom % or more and 3 atom % or less.

In a case where the concentration of C in the SiCN film exceeds 5 atom %, although the amount of defects formed in the SiCN film may be increased, the film density may be lowered, such that a leakage resistance of the SiCN film may be lowered. By setting the concentration of C in the SiCN film to 5 atom % or less, deterioration of the leakage resistance of the SiCN film may be avoided. By setting the concentration of C in the SiCN film to 4 atom % or less, it is possible to more sufficiently avoid deterioration of the leakage resistance of the SiCN film. By setting the concentration of C in the SiCN film to 3 atom % or less, it is possible to even more sufficiently avoid deterioration of the leakage resistance of the SiCN film.

In a case where the concentration of C in the SiCN film is less than 1 atom %, a sufficient amount of defects may not be formed in the SiCN film, such that charge trap characteristics of the SiCN film may deteriorate. By setting the concentration of C in the SiCN film to 1 atom % or more, a sufficient amount of defects may be formed in the SiCN film, such that the charge trap characteristics of the SiCN film may be enhanced. By setting the concentration of C in the SiCN film to 1.5 atom % or more, the charge trap characteristics of the SiCN film may be more enhanced. By setting the concentration of C in the SiCN film to 2 atom % or more, the charge trap characteristics of the SiCN film may be even more enhanced.

(After-Purge and Returning to Atmospheric Pressure)

After the film-forming process is completed, an inert gas as a purge gas is supplied into the process chamber 201 via each of the nozzles 249*a* to 249*c* and is exhausted via the exhaust port 231*a*. As a result, the interior of the process chamber 201 is purged to remove a gas, reaction by-products, and the like remaining in the process chamber 201 from the interior of the process chamber 201 (after-purge). After that, the internal atmosphere of the process chamber 201 is substituted with an inert gas (inert gas substitution) and the internal pressure of the process chamber 201 is returned to the normal pressure (returning to atmospheric pressure).

(Boat Unloading and Wafer Discharging)

After that, the seal cap 219 is moved down by the boat elevator 115 to open the lower end of the manifold 209. Then, the processed wafers 200 supported by the boat 217 are unloaded from the lower end of the manifold 209 to the outside of the reaction tube 203 (boat unloading). After the boat unloading, the shutter 219*s* is moved and the lower end opening of the manifold 209 is sealed by the shutter 219*s* via the O-ring 220*c* (shutter close). The processed wafers 200 are unloaded to the outside of the reaction tube 203 and are then discharged from the boat 217 (wafer discharging).

(3) Effects of the Embodiments

According to the embodiments of the present disclosure, one or more effects set forth below may be achieved.

(a) by performing steps a to d non-simultaneously in the order of steps a, c, b, and d, specifically by performing step c immediately after performing step a, the concentration of C in the layer formed by nitriding the first layer may be made higher than the concentration of C in the layer formed by nitriding the second layer.

Further, when the C concentration on the surface of the first layer and the C concentration on the surface of the second layer are the same, it was confirmed by measurement by, for example, a Photo Luminescence method (PL method) that the number of defects formed in the layer formed by nitriding the first layer is larger than the number of defects formed in the layer formed by nitriding the second layer. This may be because a composition of the layer formed by nitriding the first layer tends to be closer to the stoichiometric composition than that of the layer formed by nitriding the second layer, and therefore the first layer is more susceptible to the adsorption of C than the second layer.

From the above, step c is performed immediately after step a to give the adsorption of C on the first layer a priority over the adsorption of C on the second layer, thereby making it possible to efficiently form defects in the SiCN film while suppressing the C content in the entire SiCN film. As a result, it is possible to make the SiCN film excellent in leak characteristics and charge trap characteristics.

(b) By making the density of defects formed in the layer formed by modifying the first layer higher than the density of defects formed in the layer formed by modifying the second layer, it is possible to efficiently form defects in the SiCN film while suppressing the C content in the entire SiCN film. As a result, it is possible to make the SiCN film excellent in leak characteristics and charge trap characteristics.

(c) By using a gas with a thermal decomposition temperature higher than that of the second gas, as the first gas, it is possible to increase the film formation rate of the SiCN film while improving the step coverage characteristics and the wafer in-plane film thickness uniformity of the SiCN film formed on the wafer 200.

(d) By using a gas that does not contain the Si—Si bond, as the first gas, and using a gas that contains the Si—Si bond, as the second gas, it is possible to further increase the film formation rate of the SiCN film while further improving the step coverage characteristics and the wafer in-plane film thickness uniformity of the SiCN film formed on the wafer 200.

(e) By setting the processing temperature to a temperature lower than the temperature at which the first gas is substantially thermally decomposed, in step a, and setting the processing temperature to a temperature at which the second gas is substantially thermally decomposed, in step b, it is possible to sufficiently increase the film formation rate of the SiCN film while sufficiently improving the step coverage characteristics and the wafer in-plane film thickness uniformity of the SiCN film formed on the wafer 200.

(4) Modifications

The film-forming sequence in the embodiments of the present disclosure may be changed as in the following modifications. These modifications may be used in proper combination. Unless otherwise stated, a processing procedure and a process condition in each step of each modification may be the same as the processing procedure and process condition in each step of the above-described film-forming sequence.

(First Modification)

Figure 5:
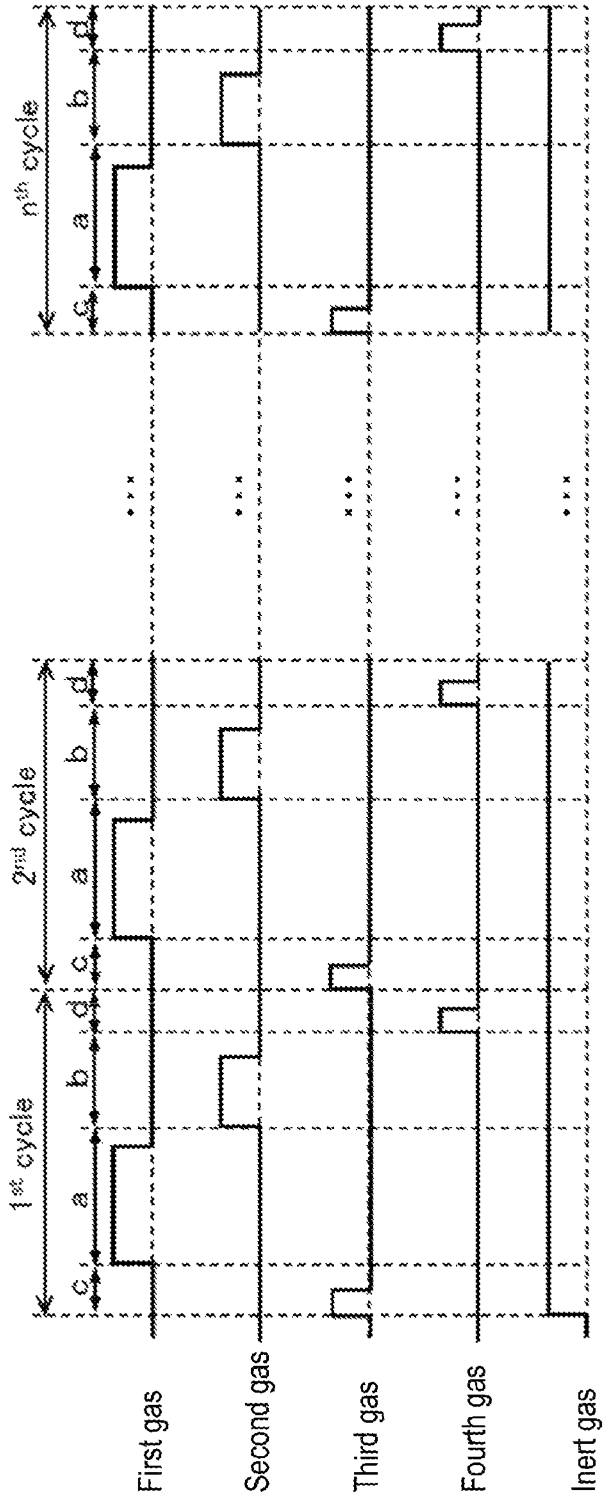
FIG. 5 is a diagram showing a processing sequence in a first modification of the present disclosure.

As in the film-forming sequence shown in FIG. 5 and below, steps a to d may be performed non-simultaneously in the order of steps c, a, b, and d. Specifically, step c may be performed immediately before performing step a. In FIG. 5, execution periods of steps a, b, c, and d are represented by a, b, c, and d, respectively.

(Third gas→First gas→Second gas→Fourth gas)×$n$⇒SiCN

The same effects as those of the above-described embodiments may be obtained in the first modification as well.

(Second Modification)

As in the film-forming sequence shown below, steps a to d may be performed non-simultaneously in the order of steps c, a, c, b, and d. Specifically, step c may be performed immediately before performing step a and immediately after performing step a.

(Third gas→First gas→Third gas→Second gas→Fourth gas)×$n$⇒SiCN

In the second modification, since the amount of C adsorbed on the first layer may be increased, the effect of efficiently forming defects in the SiCN film may be sufficiently obtained.

(Third Modification)

In the above-described embodiments, an example in which the execution period of step a and the execution period of step c do not overlap is described above, but the present disclosure is not limited thereto. For example, by starting step c to supply the second gas while continuing to supply the first gas in step a, at least a portion of the execution period of step a and at least a portion of the execution period of step c may overlap. By doing so, in addition to the above-described effects, the cycle time may be shortened, thereby improving the productivity of the film-forming process.

In this modification, the execution period of step c and the execution period of step b may not overlap. That is, purging may be performed after performing step c, and then step b may be performed. By doing so, generation of particles based on the third gas may be suppressed.

In this modification, the execution period of step c and the execution period of step d may not overlap. By doing so, in addition to the above-described effects, it is possible to suppress generation of particles due to the reaction between the third gas and the fourth gas, thereby avoiding deterioration of the film quality of the SiCN film.

(Fourth Modification)

Figure 6:
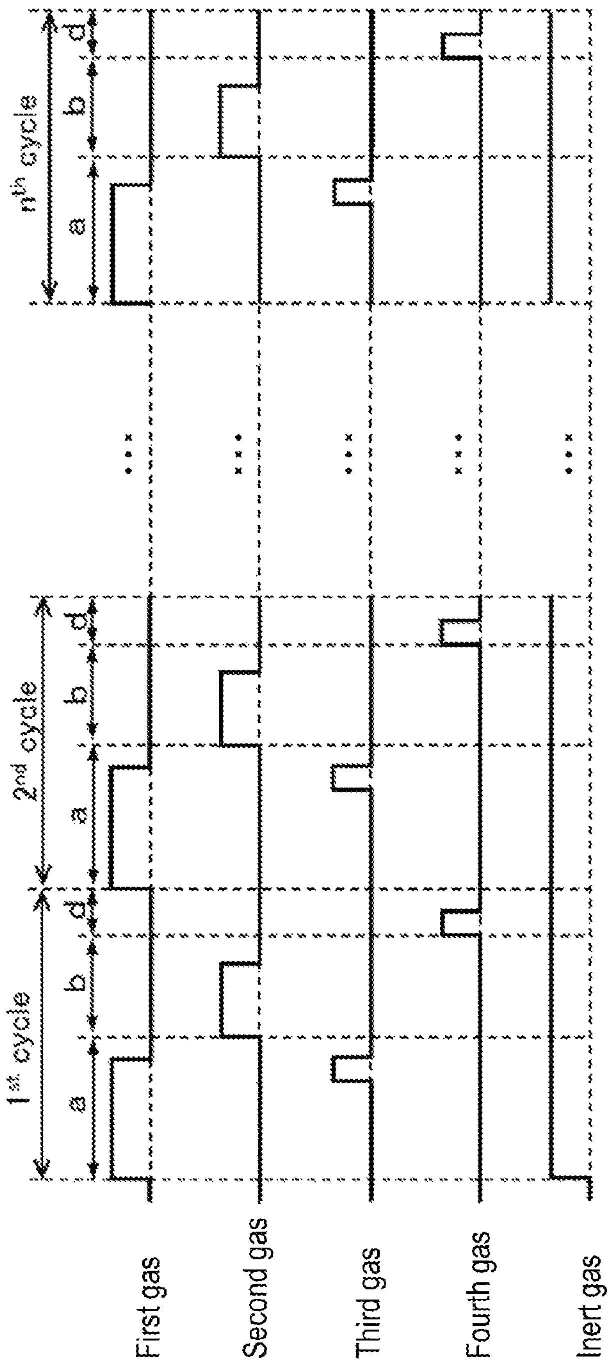
FIG. 6 is a diagram showing a processing sequence in a third modification of the present disclosure.

As in the film-forming sequence shown in FIG. 6 and below, steps a, b, and d may be performed sequentially while overlapping at least a portion of the execution period of step a and with the execution period of step c. In FIG. 6, the execution periods of steps a, b, and d are represented by a, b, and d, respectively.

(First gas+Third gas→Second gas→Fourth gas)×*n*⇒SiCN

In the fourth modification, in addition to the above-described effects, the cycle time may be shortened, thereby improving the productivity of the film-forming process.

(Fifth Modification)

As in the film-forming sequence shown below, steps a to d may be performed in the order of steps a, c, b, and d while overlapping at least a portion of the execution period of step a with the execution period of step c.

(First gas+Third gas→Third gas→Second gas→Fourth gas)×*n*⇒SiCN

In the fifth modification, since the amount of C adsorbed on the first layer may be increased, the effect of efficiently forming defects in the SiCN film may be more sufficiently obtained.

(Sixth Modification)

As in the film-forming sequence shown below, steps a to d may be performed in the order of steps c, a, b, and d while overlapping at least a portion of the execution period of step a with the execution period of step c.

(Third gas→First gas+Third gas→Second gas→Fourth gas)×*n*⇒SiCN

In the sixth modification, since the amount of C adsorbed on the first layer may be increased, the effect of efficiently forming defects in the SiCN film may be more sufficiently obtained.

(Seventh Modification)

As in the film-forming sequence shown below, steps a to d may be performed in the order of steps c, a, c, b, and d while overlapping at least a portion of the execution period of step a with the execution period of step c.

(Third gas→First gas+Third gas→Third gas→Second gas→Fourth gas)×*n*⇒SiCN

In the seventh modification, since the amount of C adsorbed on the first layer may be increased, the effect of efficiently forming defects in the SiCN film may be more sufficiently obtained.

Other Embodiments of the Present Disclosure

The embodiments of the present disclosure are specifically described above. However, the present disclosure is not limited to the above-described embodiments, and various changes may be made without departing from the gist thereof.

For example, in the above-described embodiments, the example of using the third gas containing C as the predetermined element is described above. However, the present disclosure is not limited thereto. For example, a third gas containing boron (B) as the predetermined element may be used.

In this case, for example, borohydride-based gases such as a monoborane ($BH_3$) gas, a diborane ($B_2H_6$) gas, and a tetraborane ($B_4H_{10}$) gas may be used as the third gas. One or more selected from the group of these gases may be used as the third gas.

In addition to the borohydride-based gases, boron chloride-based gases such as a boron trichloride ($BCl_3$) gas and a diboron tetrachloride ($B_2Cl_4$) may be used as the third gas. One or more selected from the group of these gases may be used as the third gas. Further, the boron chloride-based gases, rather than the borohydride-based gases, may be used as the third gas in that the processing temperature may be lowered.

When the gas containing B is used as the third gas, a silicon boronitride film (SiBN film) containing Si, N, B, and the like may be formed on the wafer 200. By adding B to the film, defects (crystal defects) that capture (trap) charges in the film may be formed. Also in this case, the same effects as those of the above-described embodiments may be obtained.

In the above-described embodiments and the present embodiment, the example of using either the third gas containing C or the third gas containing Bis described above. However, the disclosure is not limited thereto. For example, both the third gas containing C and the third gas containing B may be supplied. Of these two different third gases, one of them (for example, the third gas containing B) may also be particularly referred to as a fifth gas containing a second predetermined element.

Specifically, a third gas containing C (third gas containing a predetermined element) and a third gas containing B (fifth gas containing a second predetermined element) may be supplied simultaneously.

Further, the third gas containing C and the third gas containing B may be supplied continuously. At this time, the supply of one third gas may be started immediately after the supply of the other third gas is completed. Further, a portion of the supply period of one third gas may overlap with a portion of the supply period of the other third gas, such as staring the supply of the other third gas while continuing to supply the one third gas.

Further, the third gas containing C and the third gas containing B may be intermittently supplied. For example, after the supply of one third gas is completed and a predetermined time elapses, the supply of the other third gas may be started.

Also in these cases, the same effects as those of the above-described embodiments may be obtained. Further, in the case of supplying both the third gas containing C and the third gas containing B, when these gases are supplied simultaneously, the largest number of defects may be formed in the film.

Recipes used in each process may be provided individually according to the processing contents and may be stored in the memory 121*c* via a telecommunication line or the external memory 123. Moreover, at the beginning of each process, the CPU 121*a* may properly select an appropriate recipe from the recipes stored in the memory 121*c* according to the processing contents. Thus, it is possible for a single substrate processing apparatus to form films of various kinds, composition ratios, qualities, and thicknesses with enhanced reproducibility. Further, it is possible to reduce an operator's burden and to quickly start each process while avoiding an operation error.

The above-mentioned recipes are not limited to newly-provided ones but may be provided, for example, by modifying existing recipes that are already installed in the substrate processing apparatus. Once the recipes are modified, the modified recipes may be installed in the substrate processing apparatus via a telecommunication line or a recording medium storing the recipes. Further, the existing recipes already installed in the existing substrate processing apparatus may be directly modified by operating the input/output device 122 of the substrate processing apparatus.

An example in which a film is formed by using a batch-type substrate processing apparatus capable of processing a plurality of substrates at a time is described in the above-described embodiments. The present disclosure is not limited to the above-described embodiments, but may be suitably applied, for example, to a case where a film is formed by using a single-wafer type substrate processing apparatus capable of processing a single substrate or several substrates at a time. Further, an example in which a film is formed by using a substrate processing apparatus including a hot-wall-type process furnace is described in the above-described embodiments. The present disclosure is not limited to the above-described embodiments, but may be suitably applied to a case where a film is formed by using a substrate processing apparatus including a cold-wall-type process furnace.

Even in the case of using these substrate processing apparatuses, each process may be performed according to the same processing procedures and process conditions as those in the above-described embodiments, and the same effects as those of the above-described embodiments are achieved.

The above-described embodiments may be used in proper combination. A processing procedure and a process condition used in this case may be the same as, for example, the processing procedures and process conditions in the above-described embodiments. In the above-described embodiments, the example in which the steps are performed non-simultaneously is described. However, as long as the film characteristics are not affected, there may be a period during which steps are performed simultaneously.

EXAMPLES

Using the above-described substrate processing apparatus, a SiCN film is formed on a wafer by performing the following film-forming sequence to provide Samples 1 to 4.

Sample 1: (First gas→Third gas→Second gas→Fourth gas)×n

Sample 2: (Third gas→First gas→Second gas→Fourth gas)×n

Sample 3: (First gas→Second gas→Fourth gas)×n

Sample 4: (First gas→Second gas→Third gas→Fourth gas)×n

A STC gas is used as the first gas, a HCDS gas is used as the second gas, a $C_{33}H_6$ gas is used as the third gas, and a $NH_3$ gas is used as the fourth gas. The process condition is a predetermined condition within a range of the process condition in each step shown in the above-described embodiments.

After providing Samples 1 to 4, C concentration in the SiCN film, a density of defects formed in the SiCN film, and a quality of leakage resistance of the SiCN film are measured for each of Samples 1 to 4.

The measurement of the C concentration in the SiCN film is performed by using photoelectron spectroscopy (XPS). As shown in FIG. 8, the C concentrations (the atomic concentrations of C) in the SiCN films of Samples 1 to 4 are 1.81 atom %, 2.74 atom %, 0 atom %, and 1.09 atom %, respectively. It is confirmed that a film of Sample 3 in which step c is not performed does not contain C or substantially does not contain C. It is confirmed that the C concentrations of Samples 1, 2, and 4 show good results of 5 atom % or less, and among the samples, the C concentration of Sample 2 becomes a value within a range of 2 atom % or more and 3 atom % or less, which is the best one. Further, it is confirmed that the C concentration of Sample 1 becomes a value within the range of 1.5 atom % or more and 4 atom % or less, which is the second best one.

The density of defects formed in the SiCN film is measured by measuring a total peak area of the SiCN film by the PL method. As a value of the total peak area becomes larger, it indicates that a density of defects formed in the film becomes higher. As shown in FIG. 8, the total peak area values of Samples 1 to 4 are 26261.9, 27719.2, 9733.4, and 21586.2, respectively. Therefore, it is found that Sample 2 shows the highest defect density and Sample 1 shows the second highest defect density. Furthermore, the defect densities of Samples 1 and 2 are higher than that of Sample 4. This may be because the C concentrations of Samples 1 and 2 are higher than the C concentration of Sample 4. This is because it was experimentally found that the STC gas absorbs C more easily than the HCDS gas. Therefore, it is believed that in a case where C is supplied immediately before and after the STC gas is supplied, C is efficiently absorbed to increase the concentration of C, resulting in the increase in defects.

The quality of the leakage resistance of the SiCN film is determined by measuring a leakage current ($A/cm^2$) flowing through the SiCN film when an electrolysis of 6 MV/cm is applied to the SiCN film. As a result, it is confirmed that the leak current of Sample 1 is the smallest and the leak resistance of Sample 1 is the best.

From the above, it turned out that Sample 1 is suitable for the C concentration in the SiCN film, the density of defects formed in the SiCN film, and the leak resistance of the SiCN film, and Sample 2 is particularly good for the C concentration in the SiCN film and the density of defects formed in the SiCN film.

According to the present disclosure in some embodiments, it is possible to provide a technique capable of improving the characteristics of a film formed on a substrate.

While certain embodiments have been described, these embodiments have been presented by way of example, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of processing a substrate, comprising:

forming a film containing silicon, a predetermined element, and nitrogen on the substrate by performing a cycle a predetermined number of times, the cycle including:

(a) forming a first layer by supplying a first gas, which contains silicon, does not contain a Si-Si bond, and does not contain nitrogen, to the substrate;

(b) forming a second layer by supplying a second gas, which is a chlorosilane gas containing a Si-Si bond, to the substrate;

(c) supplying a third gas containing the predetermined element to the substrate; and (d) modifying the first layer and the second layer by supplying a fourth gas containing nitrogen to the substrate, wherein an element capable of forming defects in the film is used as the predetermined element, and wherein in the cycle, (a) to (d) are performed in an order of: (a), (c), (b), and (d); (c), (a), (b), and (d); or (c), (a), (c), (b), and (d).

2. The method of claim 1, wherein at least a portion of an execution period of (a) overlaps with at least a portion of an execution period of (c).

3. The method of claim 2, wherein the execution period of (c) does not overlap with an execution period of (b).

4. The method of claim 2, wherein the execution period of (c) does not overlap with an execution period of (d).

5. The method of claim 1, wherein in the cycle, (a) to (d) are performed in the order of (a), (c), (b), and (d).

6. The method of claim 1, wherein in the cycle, (a) to (d) are performed in the order of (c), (a), (b), and (d).

7. The method of claim 1, wherein in the cycle, (a) to (d) are performed in the order of (c), (a), (c), (b), and (d).

8. The method of claim 1, wherein at least one selected from the group of carbon and boron is used as the predetermined element.

9. The method of claim 1, wherein at least one gas selected from the group of a hydrocarbon-based gas, an amine-based gas, a boron chloride-based gas, and a borohydride-based gas is used as the third gas.

10. The method of claim 1, wherein a concentration of the predetermined element in the film is 5 atom % or less.

11. The method of claim 10, wherein the concentration of the predetermined element in the film is 1 atom % or more.

12. The method of claim 1, wherein the film is a charge trap film of a nonvolatile memory cell.

13. The method of claim 1, wherein the cycle further includes (e) supplying a fifth gas containing a second predetermined element to the substrate, and wherein at least a portion of an execution period of (c) overlaps with at least a portion of an execution period of (e).

14. The method of claim 1, wherein the cycle further includes (e) supplying a fifth gas containing a second predetermined element to the substrate, and wherein an execution period of (c) is continuous with an execution period of (e).

15. The method of claim 1, wherein, when the first gas alone exists in a space where the substrate is placed, a temperature of the substrate in (a) is set to a temperature lower than the temperature at which the first gas is substantially thermally decomposed, and wherein, when the second gas alone exists in the space where the substrate is placed, the temperature of the substrate in (b) is set to a temperature at which the second gas is substantially thermally decomposed.

16. The method of claim 15, wherein the temperature of the substrate in (a) and (b) is 450 degrees C. or higher and 750 degrees C. or lower.

17. A method of manufacturing a semiconductor device, comprising the method of claim 1.

18. A substrate processing apparatus comprising:

a process chamber in which a process of forming a film on a substrate is performed;

a first gas supply system configured to supply a first gas, which contains silicon, does not contain a Si-Si bond, and does not contain nitrogen, to the substrate in the process chamber;

a second gas supply system configured to supply a second gas, which is a chlorosilane gas containing a Si-Si bond, to the substrate in the process chamber;

a third gas supply system configured to supply a third gas, which contains a predetermined element capable of forming defects in the film, to the substrate in the process chamber;

a fourth gas supply system configured to supply a fourth gas containing nitrogen to the substrate in the process chamber; and a controller configured to be capable of controlling the first gas supply system, the second gas supply system, the third gas supply system, and the fourth gas supply system to perform a process including:

forming the film, which contains silicon, the predetermined element, and nitrogen, on the substrate in the process chamber by performing a cycle a predetermined number of times, the cycle including:

(a) forming a first layer by supplying the first gas to the substrate;

(b) forming a second layer by supplying the second gas to the substrate;

(c) supplying the third gas to the substrate; and (d) modifying the first layer and the second layer by supplying the fourth gas to the substrate, wherein in the cycle, (a) to (d) are performed in an order of: (a), (c), (b), and (d); (c), (a), (b), and (d); or (c), (a), (c), (b), and (d).

19. A non-transitory computer-readable recording medium storing a program that causes, by a computer, a substrate processing apparatus that performs a film-forming process on a substrate to perform a process, in a process container included in the substrate processing apparatus, comprising:

forming a film containing silicon, a predetermined element, and nitrogen on the substrate by performing a cycle a predetermined number of times, the cycle including:

(a) forming a first layer by supplying a first gas which contains silicon, does not contain a Si-Si bond, and does not contain nitrogen, to the substrate;

(b) forming a second layer by supplying a second gas, which is a chlorosilane gas containing a Si-Si bond, to the substrate;

(c) supplying a third gas containing the predetermined element to the substrate, the predetermined element is capable of forming defects in the film; and (d) modifying the first layer and the second layer by supplying a fourth gas containing nitrogen to the substrate, wherein in the cycle, (a) to (d) are performed in an order of: (a), (c), (b), and (d); (c), (a), (b), and (d); or (c), (a), (c), (b), and (d).

20. The method of claim 1, wherein the first gas is a halosilane-based gas.

21. The method of claim 1, wherein the second gas is an inorganic-based gas.

22. The method of claim 1, wherein a density of defects formed in a layer formed by modifying the first layer in (d)

is higher than a density of defects formed in a layer formed by modifying the second layer in (d).

* * * * *